(12) United States Patent
Masenas et al.

(10) Patent No.: US 6,504,499 B1
(45) Date of Patent: Jan. 7, 2003

(54) ANALOG-TO-DIGITAL CONVERTER HAVING POSITIVELY BIASED DIFFERENTIAL REFERENCE INPUTS

(75) Inventors: Charles Joseph Masenas, Essex Junction, VT (US); Sharon Lynne Von Bruns, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/703,974

(22) Filed: Nov. 1, 2000

(51) Int. Cl.$^7$ ............................................. H03M 1/12
(52) U.S. Cl. ....................... 341/155; 341/154; 341/156; 341/118; 327/52; 327/63; 327/81; 327/85
(58) Field of Search ................................. 341/154, 155, 341/156, 106, 118; 327/52, 63, 51, 85

(56) References Cited

U.S. PATENT DOCUMENTS

| | | | | |
|---|---|---|---|---|
| 4,903,020 A | * | 2/1990 | Wermuth et al. | 341/106 |
| 5,194,866 A | * | 3/1993 | Imaizumi et al. | 341/156 |
| 5,287,015 A | * | 2/1994 | Moyal et al. | 307/355 |
| 5,416,484 A | * | 5/1995 | Lofstrom | 327/77 |
| 5,543,793 A | | 8/1996 | Saiki | 341/155 |
| 5,554,989 A | | 9/1996 | Kumamoto et al. | 341/159 |
| 5,563,598 A | * | 10/1996 | Hickling | 341/155 |
| 5,731,776 A | | 3/1998 | Kumamoto et al. | 341/159 |
| 5,734,342 A | | 3/1998 | Mes | 341/159 |
| 5,950,115 A | * | 9/1999 | Momtaz et al. | 455/73 |
| 5,990,814 A | * | 11/1999 | Croman et al. | 341/118 |
| 6,084,538 A | * | 7/2000 | Kostelnik et al. | 341/118 |
| 6,169,424 B1 | * | 1/2001 | Kurd | 327/53 |

FOREIGN PATENT DOCUMENTS

WO    WO92/08287    5/1992    ............ H03M/1/14

OTHER PUBLICATIONS

"CMOS Receiver For Emitter–Coupled Logic Levels," vol. 31, No. 10, Mar. 1989, pp. 20–21.
"Complementary Fet Differential Amplifier," IBM Technical Disclosure Bulletin, Mar. 1974, 2 Pages, http://www.patents.IBM.com/TDBS/TDB?O =74% 2000811.
Fetterman, "An 8–Bit 50 + Msamples/S Piplined A/D Converter With An Area And Power Efficient Architecture," Custom Integrated Circuits Conference, IEEE, 1996.

* cited by examiner

Primary Examiner—Michael Tokar
Assistant Examiner—Linh V Nguyen
(74) Attorney, Agent, or Firm—Richard A. Henkler; Bracewell & Patterson, L.L.P.

(57) ABSTRACT

An analog-to-digital converter includes a plurality of comparators that each have an output, two analog data inputs coupled to a differential analog data input, and two reference voltage inputs. The two reference voltage inputs are each coupled to a resistor ladder that contains a plurality of resistors coupled in series. Importantly, the two reference voltage inputs of each comparator are positively biased, meaning that the positive reference voltage input is coupled to a point on the resistor ladder at a relatively higher potential than the negative reference voltage input. The outputs of the comparators are coupled to an encoder that encodes signals at the outputs into a digital signal. By positively biasing the differential reference voltage inputs of the comparators in this manner, the differential gain, dynamic voltage range, and voltage symmetry of the comparators are advantageously improved.

5 Claims, 8 Drawing Sheets

ANALOG-TO-DIGITAL CONVERTER HAVING POSITIVELY BIASED DIFFERENTIAL REFERENCE INPUTS

BACKGROUND OF THE INVENTION

1. Technical Field

The present invention relates in general to analog-to-digital conversion and, in particular, to an analog-to-digital converter having positively biased differential reference voltage inputs.

2. Description of the Related Art

Figure 1:
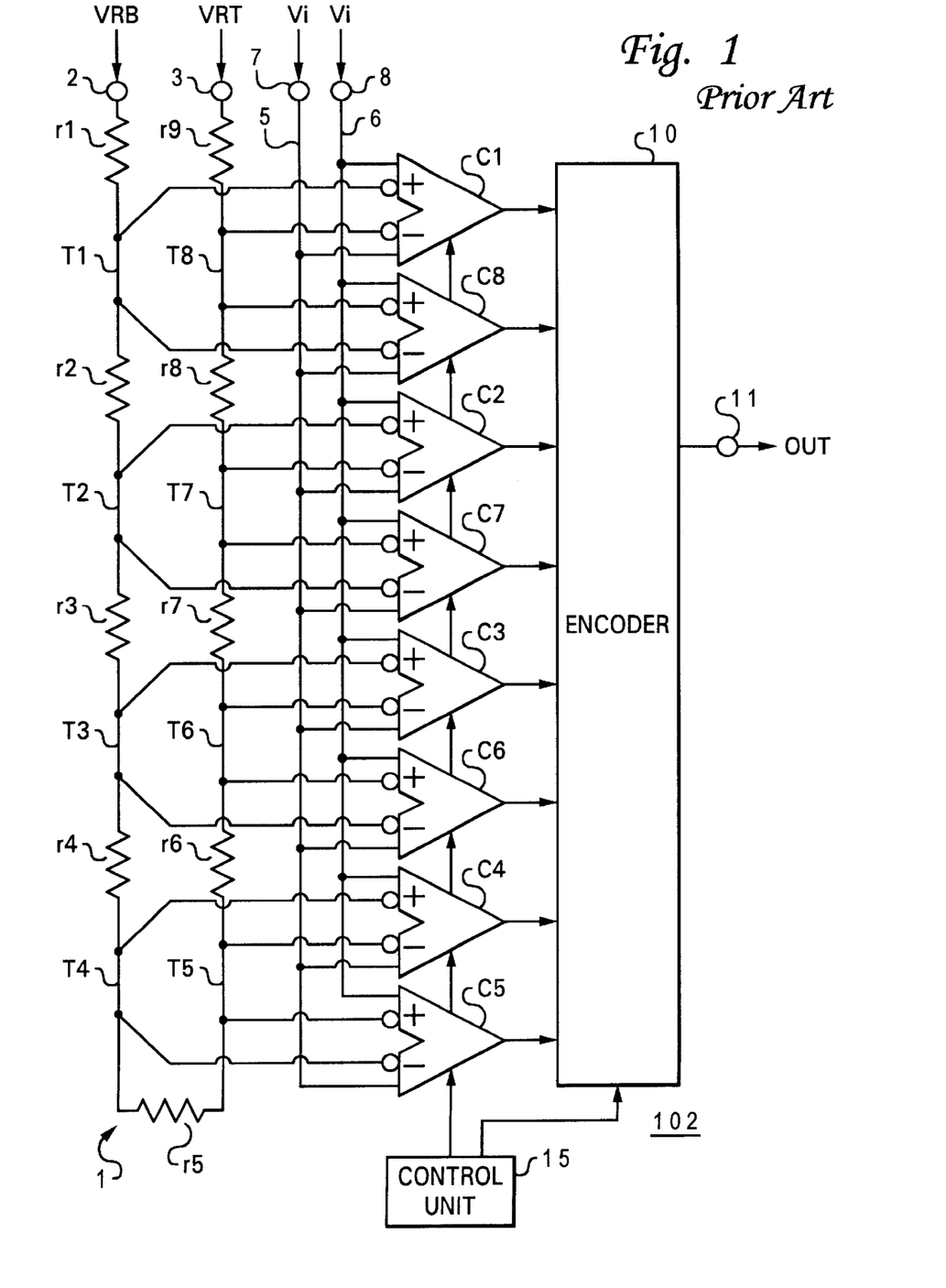
FIG. 1 depicts a high level circuit diagram of an analog-to-digital converter (ADC) in accordance with the prior art.

With reference to FIG. 1, there is depicted a circuit diagram of a prior art analog-to-digital converter (ADC) that is disclosed in U.S. Pat. No. 5,731,776 to Kumamoto et al. As shown, ADC 102 includes a resistor ladder 1, eight differential comparators C1–C8, an encoder 10, and a control unit 15. Resistor ladder 1 has a lower voltage reference terminal 2 having reference voltage VRB, an upper voltage reference terminal 3 having reference voltage VRT, and identical resistors r1–r9 connected in series there between. At the junctions of resistors r1–r9, intermediate taps T1–T8 provide a number of intermediate reference voltages.

Differential comparators C1–C8 each have an output connected to encoder 10 and four input terminals, two inverting reference input terminals connected to taps in resistor ladder 1 and two analog voltage input terminals. In general, for the differential comparator C(i)(i=1 . . . 8), the positive reference input terminal is connected to the intermediate tap T(i) provided at the junction between the resistors r(i) and r(i+1), and the negative reference input terminal is connected to the intermediate tap T(9−i) provided at the junction between the resistors r(10−i) and r(9−i). In other words, the positive reference input terminal of the differential comparator C(i) and the negative reference input terminal of the differential comparator C(9−i) are connected in common to the intermediate tap T(i). It is important to note that this arrangement results in an inversion of the reference voltage input terminals, with the positive reference voltage terminal of half of the comparators tied to a lower reference voltage than the negative reference voltage terminal. For each of differential comparators C1–C8, the positive analog voltage input terminal is connected to a differential input signal line 6 having analog voltage Vi, and the negative analog voltage input terminal is connected to a differential input signal line 5 having the complementary analog voltage Vi*.

In operation, each of differential comparators C1–C8 compares the difference between analog input voltages Vi and Vi* with the difference between the reference voltages applied to its inverting reference voltage inputs and outputs a digital signal indicative of the comparison result. In other words, each of differential comparators C1–C8 amplifies the difference between $(V_{in+}-V_{in-})$ and $(-V_{ref+}(-V_{ref-}))$ and outputs the amplified difference. Thus, an output voltage signal $V_{out}$ generated by each of differential comparators C1–C8 is expressed as $V_{out}=G\times((V_{in+}-V_{in-})-(-V_{ref+}-(-V_{ref-})))$, where G is the gain of the comparator.

Because the resistances of resistors r1–r9 are equal, the value of divided reference voltage $(-V_{ref+}-(-V_{ref-}))$ increases in equal intervals in the order of differential comparators C1–C8. Thus, if the difference between the input voltage signals Vi and Vi* is higher than the divided reference voltage between intermediate taps T2 and T7 and lower than the divided reference voltage between intermediate taps T3 and T6, the difference between the input voltage signals Vi and Vi* is higher than the divided reference voltages applied to differential comparators C1–C2 and lower than the divided reference voltages applied to differential comparators C3–C8. Consequently, differential comparators C1–C2 output logic high signals and differential comparators C3–C8 output logic low signals. Encoder 10 encodes the signals output by differential comparators C1–C8 into a three-bit digital signal and a one-bit overflow indication. In this manner, ADC 102 converts the analog differential input voltage signals Vi and Vi* into a digital signal.

Although the design of ADC 102 is advantageous in terms of semiconductor chip floor planning in that the wiring length between taps T1–T8 and the associated differential comparators C1–C8 is minimized, ADC 102 is subject to a number of drawbacks appreciated by the present invention. In particular, the inversion of reference voltage inputs to differential comparators C1–C4 negatively biases the comparator circuitry and can create asymmetry in the voltage differences generated by comparator pairs C1 and C8, C2 and C7, C3 and C6 and C4 and C5 for certain comparator designs. Such voltage asymmetry can yield asymmetrical conversion results for analog voltages of equivalent magnitude and opposite sign. In addition, for at least some comparator designs, the inversion of the reference voltage inputs can disadvantageously reduce both the dynamic voltage range of the transistors comprising the comparator and the differential gain. As will be appreciated, as lower power integrated circuits having lower reference voltages are designed, the differential gain provided by the differential comparators becomes increasing important in order to correctly quantize analog signals with high precision.

SUMMARY OF THE INVENTION

The present invention addresses and overcomes the foregoing and other shortcomings of the prior art by providing an improved analog-to-digital converter (ADC) having positively biased reference voltage inputs.

An analog-to-digital converter in accordance with the present invention includes a plurality of comparators that each have an output, two analog data inputs coupled to a differential analog data input, and two reference voltage inputs. The two reference voltage inputs are each coupled to a resistor ladder that contains a plurality of resistors coupled in series. Importantly, the two reference voltage inputs of each comparator are positively biased, meaning that the positive reference voltage input is coupled to a point on the resistor ladder at a relatively higher potential than the negative reference voltage input. The outputs of the comparators are coupled to an encoder that encodes signals at the outputs into a digital signal. By positively biasing the differential reference voltage inputs of the comparators in this manner, the differential gain, dynamic voltage range, and voltage symmetry of the comparators are advantageously improved.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 2:
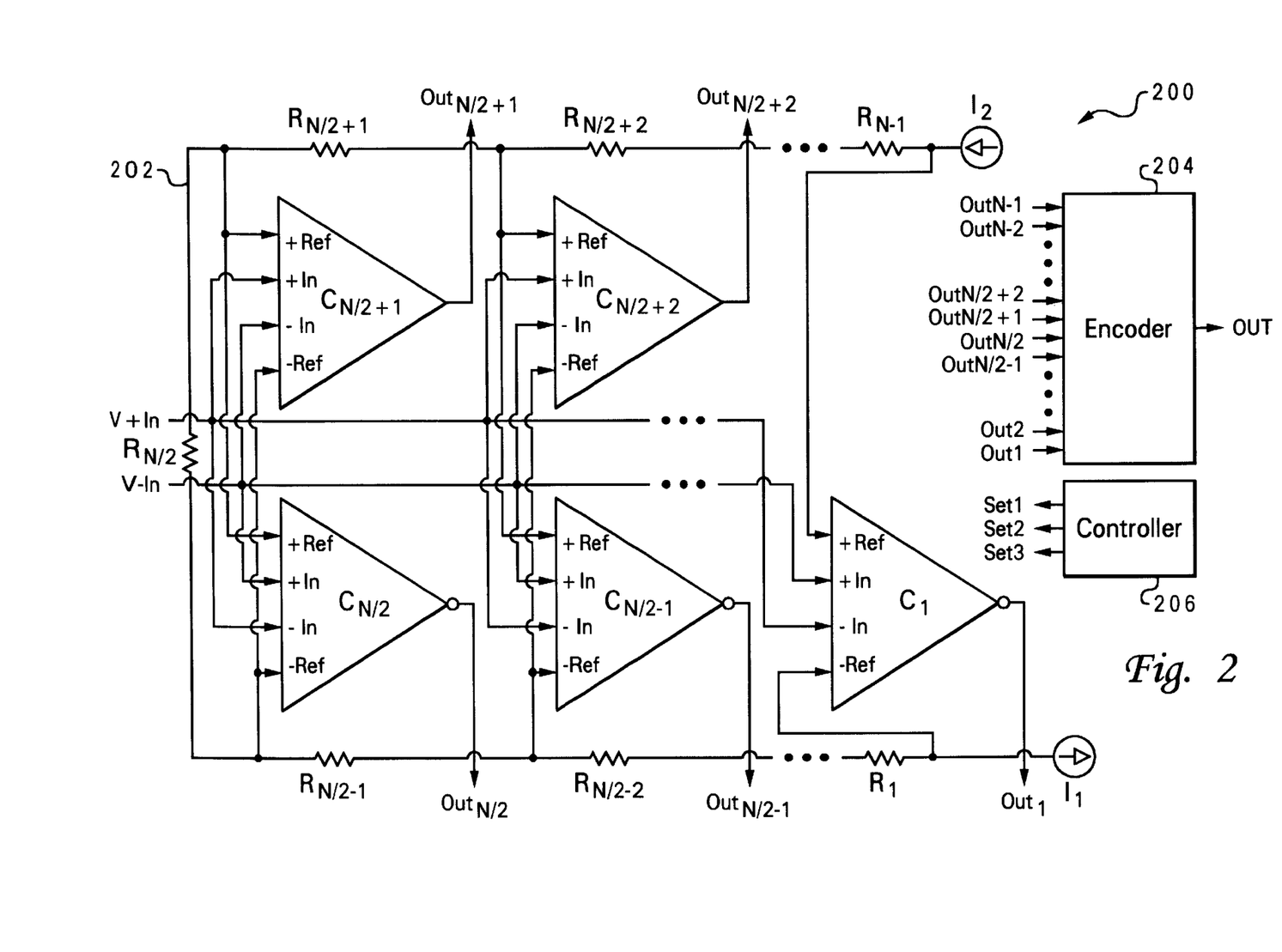
FIG. 2 illustrates a high level circuit diagram of an analog-to-digital converter (ADC) in accordance with a preferred embodiment of the present invention.

With reference again to the figures and in particular with reference to FIG. 2, there is illustrated a high level circuit diagram of a flash analog-to-digital converter (ADC) in accordance with a preferred embodiment of the present invention. As illustrated, ADC 200 includes a resistor ladder 202, N-1 (where N is a power of two) differential comparators $C_1$-$C_{N-1}$, an encoder 204, and a controller 206. Resistor ladder 202 includes N-1 identical value resistors $R_1$-$R_{N-1}$ connected in series between two current sources $I_1$, and $I_2$. At the junctions of resistors $R_1$-$R_{N-1}$, a number of reference voltages are provided. For example, in one typical CMOS embodiment, N is 64, current sources $I_1$ and $I_2$ are 50 microampere current sources, the value of resistors $R_1$-$R_{N-1}$ is 220 ohms, and the voltage drop across each resistor is 11 millivolts (mV). In view of Ohm's Law, which relates voltage, current and impedance as V=IR, resistors $R_1$-$R_N$ can be viewed as a series of reference voltage sources and, in alternative embodiments of the invention, can be replaced by other suitable reference voltage sources. Although not illustrated, to further stabilize the reference voltages, the center of resistor ladder 202 (i.e., the center of resistor $R_{N/2}$) can be tied to a reference voltage of $V_{DD}/2$.

Differential comparators $C_1$-$C_{N-1}$ each have a respective output ($Out_1$-$Out_{N-1}$) connected to encoder 204 and four inputs: two non-inverting reference voltage inputs (+Ref and −Ref) connected to resistor ladder 202 and two analog data inputs (+In and −In). In the depicted embodiment, differential comparators $C_2$-$C_{N-1}$ (i.e., all differential comparators except $C_1$) are paired, such that the differential comparators forming each pair have their corresponding reference voltage inputs connected to the same reference voltages provided by resistor ladder 202. For example, the positive reference voltage inputs (+Ref) of differential comparators $C_{N-1}$ and $C_2$ are both connected to the intermediate reference voltage provided at the junction between $R_{N-1}$ and $R_{N-2}$, and the negative reference voltage inputs (−Ref) of differential comparators $C_{N-1}$ and $C_2$ are both connected to the intermediate reference voltage provided at the junction between $R_1$ and $R_2$. Similarly, the positive reference voltage inputs (+Ref) of differential comparators $C_{N/2}$ and $C_{N/2+1}$ are both connected to the intermediate reference voltage provided at the junction between $R_{N/2+1}$ and $R_{N/2}$, and the negative reference voltage inputs (−Ref) of differential comparators $C_{N/2}$ and $C_{N/2+1}$ are both connected to the intermediate reference voltage provided at the junction between $R_{N/2}$ and $R_{N/2-1}$. In this manner, the same differential reference voltage is received as an input by the differential comparators in each pair; and the differential reference voltages received as inputs by differential comparators in different pairs are different. As discussed further below, it should also be noted that all differential reference voltages provided as inputs to differential comparators $C_1$-$C_{N-1}$ are positively biased, that is, the positive reference voltage input (+Ref) of every differential comparator is connected to a higher reference voltage than its negative reference voltage input (−Ref).

As further illustrated in FIG. 2, ADC 200 has a differential analog data input including a positive analog data terminal ($V_{+IN}$) and a negative analog data terminal ($V_{-In}$). The differential analog data input receives an analog signal that is to be converted into digital format. For each of differential comparators $C_{N/2+1}$-$C_{N-1}$, which detect positive analog signals, the positive analog data input (+In) is connected to $V_{+In}$, and the negative analog data input is connected to $V_{+In}$. In contrast, for each of differential comparators $C_{N/2}$-$C_1$, which detect negative analog signals, the positive analog data input (+In) is connected to $V_{-In}$, and the negative analog data input is connected to $V_{+In}$. To account for the reversal of the polarity of the analog data inputs of differential comparators $C_{N/2}$-$C_1$, the outputs of differential comparators $C_{N/2}$-$C_1$ are inverting so that they have the same polarity as differential comparators $C_{N/2+1}$-$C_{N-1}$.

In operation, each of differential comparators $C_1$-$C_{N-1}$ compares the differential analog signal appearing at the differential analog data input with the differential reference voltage applied to its reference voltage inputs, and generates a digital output signal indicative of the comparison result. In other words, each of differential comparators $C_1$-$C_{N-1}$ amplifies the difference between (+Ref−(−Ref)) and (+In−(−In)) and outputs the amplified difference. Thus, the output voltage signal Out generated by each of differential comparators $C_{N/2+1}$-$C_{N-1}$ is expressed as $Out_i$=G×((+In−(−In))−(+Ref−(−Ref))), where G is the gain of the differential comparator. The output voltage signal Out generated by each of differential comparators $C_{N/2}$-$C_1$ can similarly be expressed as $Out_i$=−G×((+In−(−In)−(+Ref−(−Ref))).

Because the resistances of resistors $R_1$-$R_{N-1}$ are equal, the magnitude of the differential reference voltage (+Ref−(−Ref)) received by each pair of differential comparators increases in even steps from a minimum at the midpoint pair of comparators ($C_{N/2+1}$ and $C_{N/2}$) to a maximum at comparator $C_1$. Accordingly, if, for example, the differential analog data signal is higher than the differential reference voltage across $R_{N/2}$ and lower than the differential reference voltage across $R_{N/2+1}$, $R_{N/2}$ and $R_{N/2-1}$, the differential analog data signal(+In−(−In)) applied to differential comparators $C_{N/2+1}$-$C_{N-1}$ will be higher than the differential reference voltage applied to differential comparator $C_{N/2+1}$ and lower than the differential reference voltages applied to differential comparators $C_{N/2+2}$-$C_{N-1}$. Consequently, differential comparator $C_{N/2+1}$ will output a logic high signal, and differential comparators $C_{N/2+2}$-$C_{N-1}$ will output logic low signals. Further, the differential analog data signal (+In−(−In)) applied to differential comparators $C_1$-$C_{N/2}$ will be lower than the differential reference voltages applied to differential comparators $C_1$-$C_{N/2}$, and consequently differential comparators $C_1$-$C_{N/2}$ will output logic high signals. In other words, the collective outputs of comparators $C_1$-$C_{N/1}$ provide an N−1 bit decoded indication (often termed a "thermometer" or "window shade" code) of the digital value of the analog data signal. This decoded indication is in turn encoded by encoder 204 in a known manner to produce a digital output signal (OUT) comprising $\log_2(N)$ bits. Thus, if N is 64, the OUT signal comprises 6 bits.

Figure 3A:
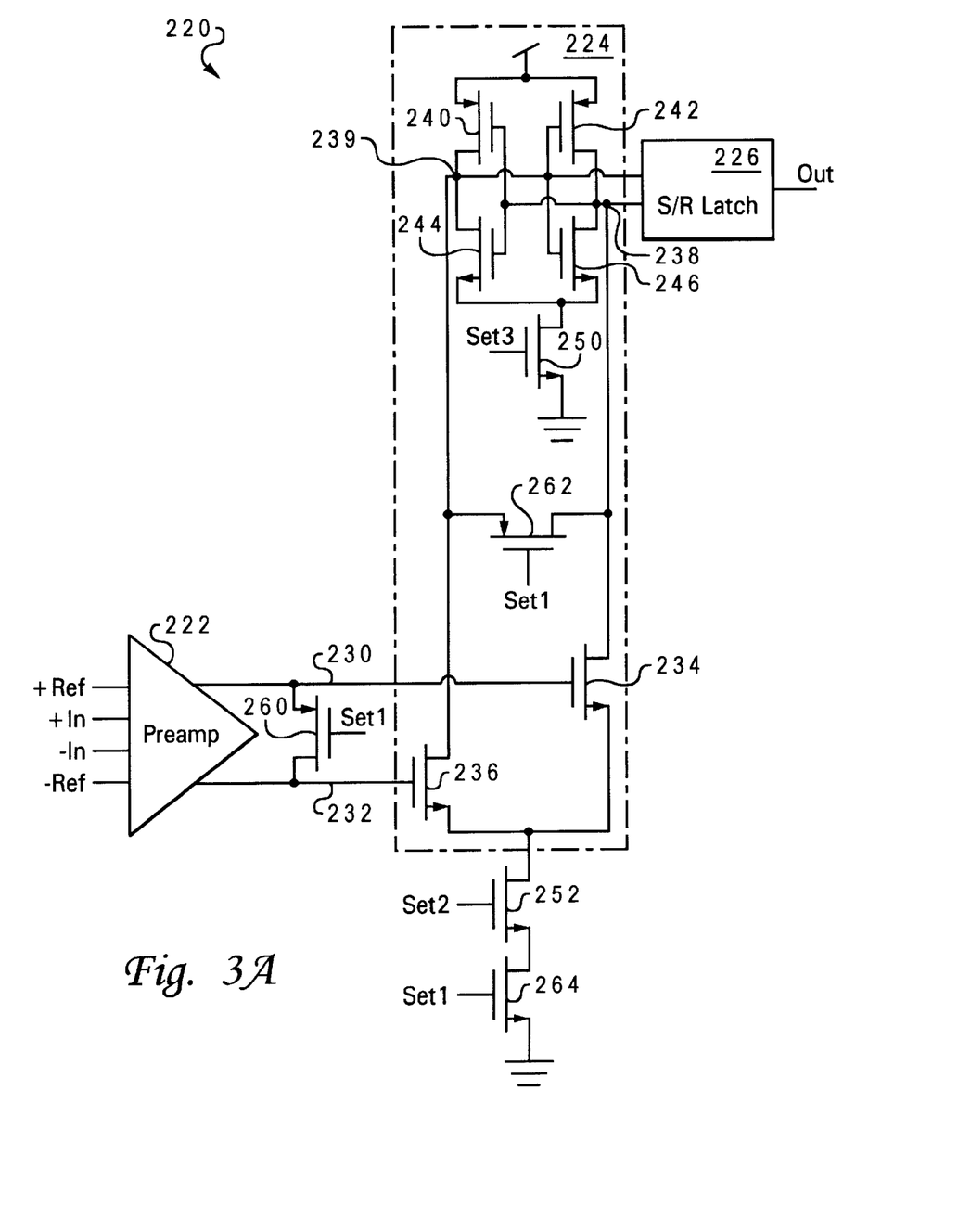
FIG. 3A depicts a more detailed circuit diagram of a differential comparator in accordance with a preferred embodiment of the present invention.

Referring now to FIG. 3A, there is depicted a circuit diagram of a preferred embodiment of differential comparator within ADC 200 in accordance with the present invention. As illustrated, differential comparator 220 includes three stages: a preamplifier 222, a clocked amplifier 224, and a set/reset (S/R) latch 226. Preamplifier 222, which receives as inputs the four inputs of comparator 220 (+Ref,−Ref,+In, and −In), generates and amplifies the differential signal (+In−(−In)−(+Ref−(−Ref)) and outputs the differential signal on first and second signal lines 230 and 232, respectively.

Amplifier 224, which further amplifies the differential signal generated by preamplifier 222, includes two input n-type field effect transistors (n-FETs) 234 and 236, which have gates coupled to signal lines 230 and 232, respectively. The sources of input n-FETs 234 and 236 are connected together, and the drains of input n-FETs 234 and 236 are coupled to nodes 238 and 239, respectively, which serve as the differential input/output nodes of amplifier 224. Amplifier 224 amplifies the differential signal appearing across nodes 238 and 239 utilizing p-type field effect transistors (p-FETs) 240 and 242 and n-FETs 244 and 246, which are interconnected to form two parallel-connected cross-coupled inverters. The resulting amplified differential signal appearing on nodes 238 and 239 is latched into S/R latch 226 and subsequently output to encoder 204.

As shown, differential comparator 220 further includes a number of timing transistors that control the operation of the various comparator stages in accordance with a three-phase clock signal comprising clock signals Set1, Set2 and Set3. In particular, amplifier 220 includes an n-FET hold transistor 250 controlled by Set3, an n-FET capture transistor 252 controlled by Set2, and three restore transistors 260, 262 and 264 controlled by Set1. As depicted in FIG. 2, the Set1, Set2 and Set3 clock signals are generated by controller 206.

Figure 3B:
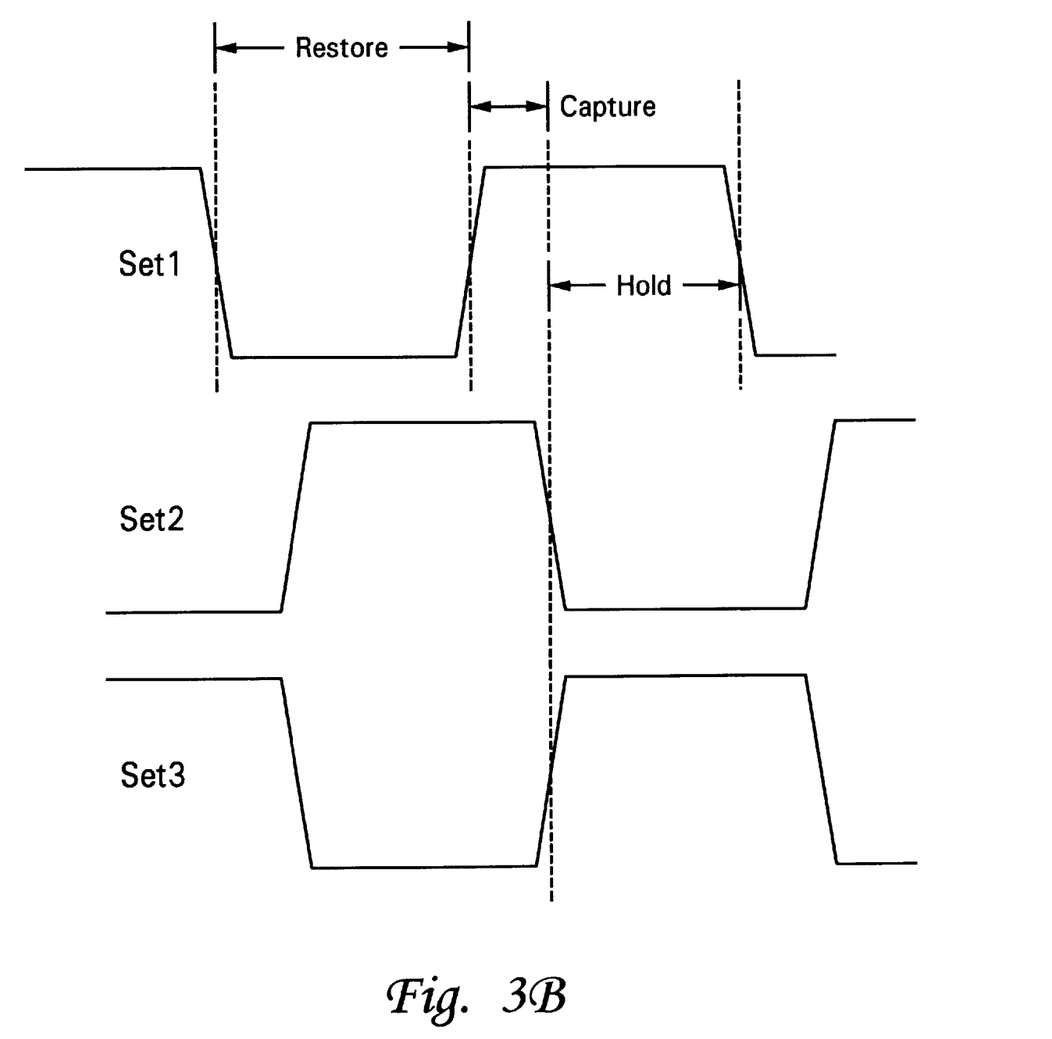
FIG. 3B is a timing diagram illustrating the relative phases of the three clocks utilized to time the operation of the differential comparator shown in FIG. 3A.

With reference now to FIG. 3B, there is illustrated a timing diagram showing the relative phases of the Set1, Set2 and Set 3 clock signals utilized to time the operation of the differential comparator 220 shown in FIG. 3A. As depicted, the operation of differential comparator 220 begins with a Restore phase in which the Set1 clock signal is in a logic low state. When the Set1 clock transitions to the logic low state, restore transistors 260 and 262 are turned on to short signal lines 230 and 232 and nodes 238 and 239, and restore transistor 264 is turned off. Although not required for proper operation, the Restore phase improves performance by reducing the differential voltage between signal lines 230 and 232 and nodes 238 and 239 to close to 0 V prior to the subsequent Capture phase.

The Capture phase begins at the close of the Restore phase when the Set1 clock signal transitions low-to-high. The low-to-high transition of the Set1 clock signal turns on restore transistor 264 and turns off restore transistors 260 and 262, thereby enabling preamplifier 222 and amplifier 224 to evaluate their inputs. The Capture phase ends and the Hold phase begins at the falling edge of the Set2 clock signal, which coincides with the rising edge of the Set3 clock signal.

The low-to-high transition of the Set3 clock signal that begins the Hold phase turns on hold transistor 250, which maintains the differential output of amplifier 224 at nodes 238 and 239. This differential output, which indicates a "0" if node 238 is logic high and node 239 is logic low and a "1" if node 238 is logic low and node 239 is logic high, is then latched into S/R latch 226 to become the new Out value of differential comparator 220. The Hold phase ends and the next Restore phase begins at the falling edge of the Set1 clock signal.

Figure 4A:
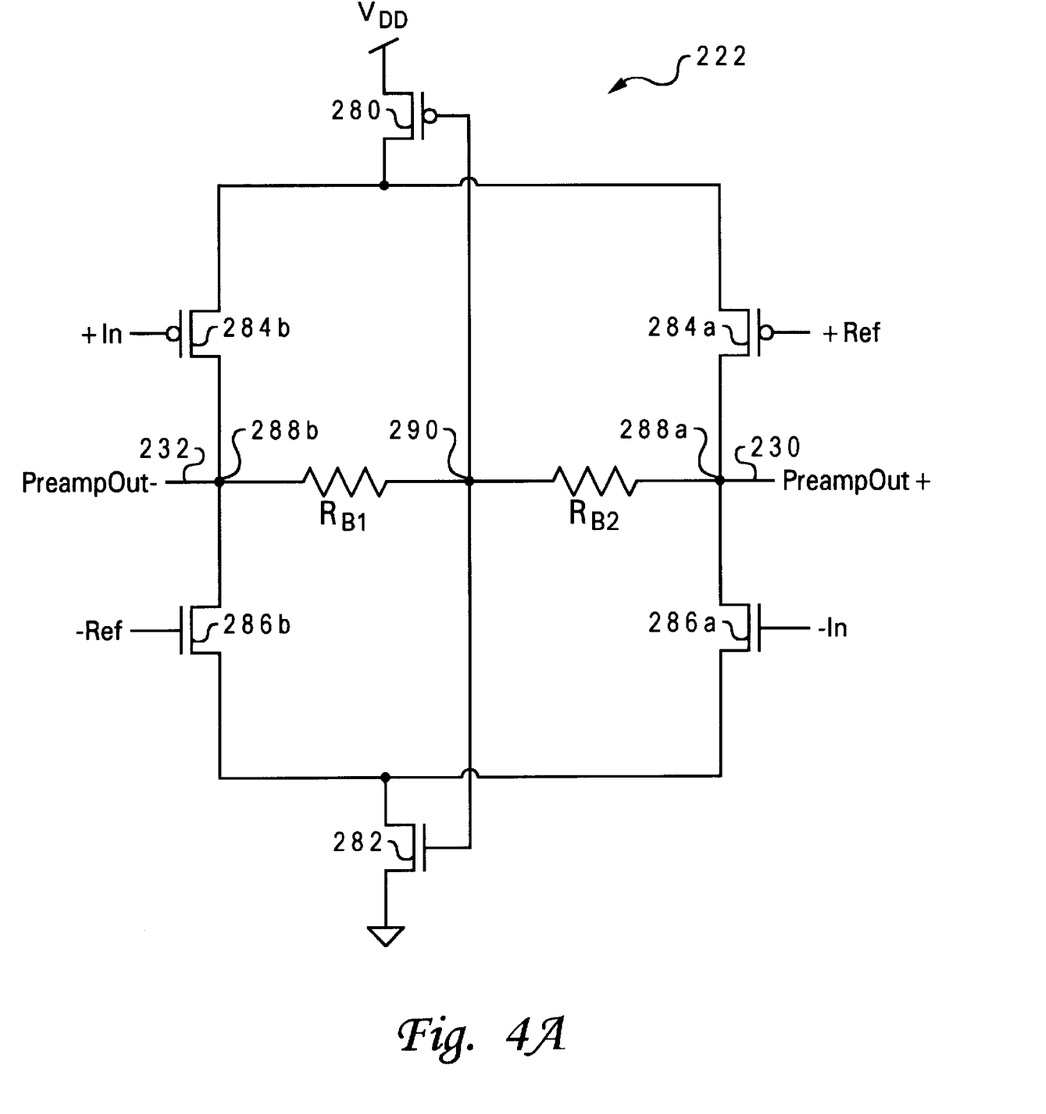
FIG. 4A is a circuit diagram of a preferred embodiment of a preamplifier within the differential comparator of FIG. 3A.

Referring now to FIG. 4A, a circuit diagram of a preferred embodiment of preamplifier 222 within differential comparator 220 of FIG. 3A is depicted. As illustrated, preamplifier 222 includes p-FET and n-FET transistors 280 and 282, respectively, which are connected in series with a pair of parallel-connected amplifiers between upper and lower reference voltage rails (e.g., $V_{DD}$ and ground). The amplifiers, which each include a p-FET 284 and an n-FET 286 connected at a respective output node 288, receive the differential reference voltage and analog data inputs of differential comparator 220 at the gates of FETs 284 and 286. In particular, it should be noted that the gate of p-FET 284a is tied to a higher reference voltage input than the gate of n-FET 286b. This arrangement places the amplifier transistors in their high gain region when the differential analog input signal places comparator 220 at or near the decision point. In addition, this arrangement results in more symmetrical biasing of the comparators in each pair.

As further shown in FIG. 4A, output nodes 288a and 288b, which are respectively connected to signal lines 230 and 232, are coupled to a common node 290 through bias resistors $R_{B1}$ and $R_{B2}$. Common node 290 is, in turn, connected to the gates of transistors 280 and 282. The coupling of output nodes 288 to the gates of current source transistors 280 and 282 through common node 290 and bias resistors $R_{B1}$ and $R_{B2}$ forms a feedback path that biases and maintains transistors 280 and 282 in their high gain region by applying to their gates the average of the differential output voltages (PreampOut+ and PreampOut−) at output nodes 288. With all transistors of preamplifier 222 biased in their high gain region, preamplifier 222 achieves a substantial amplification of the differential voltage (+In−(−In))−(+Ref−(−Ref)).

Figure 4B:
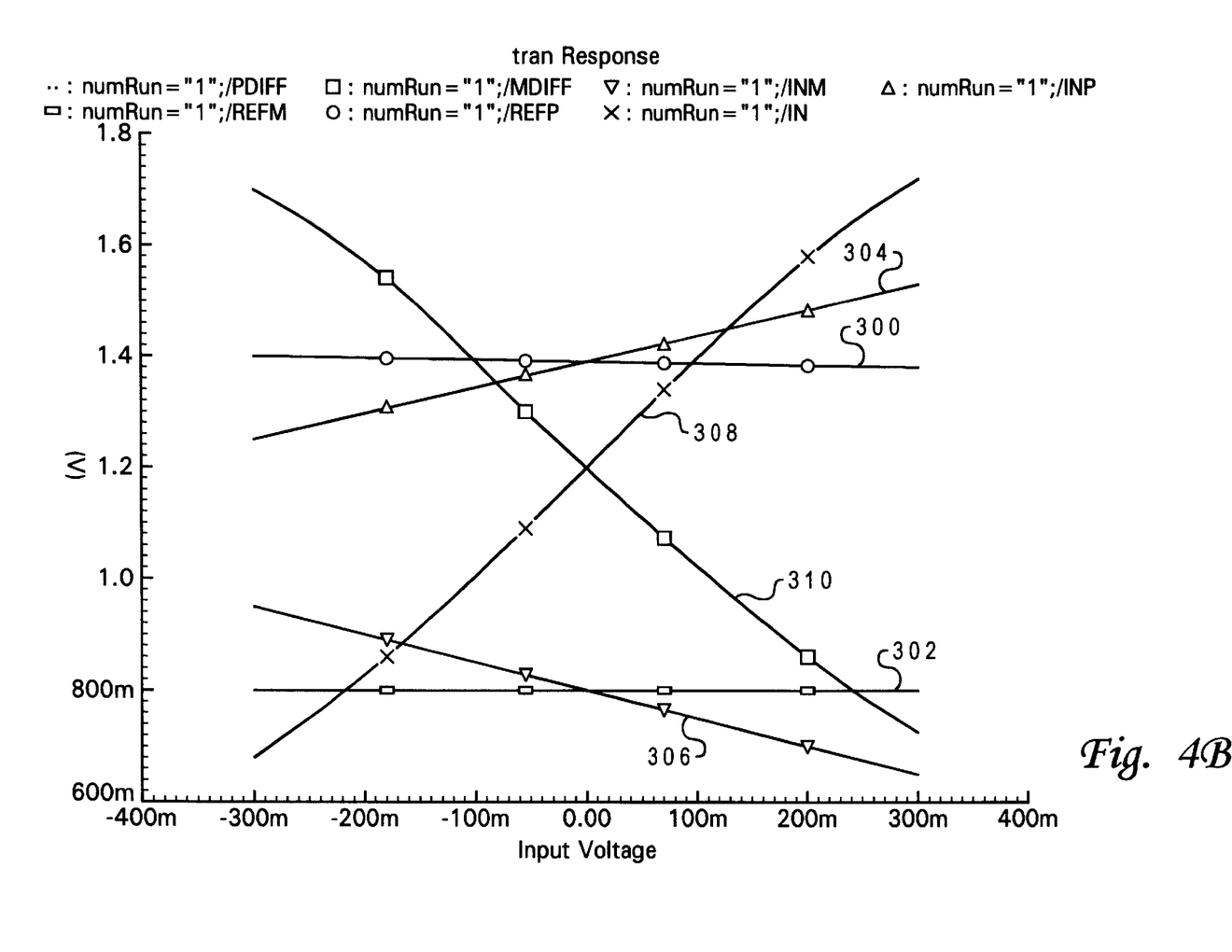
FIG. 4B illustrates the differential gain of the preamplifier circuit shown in FIG. 4A.
Figure 4C:
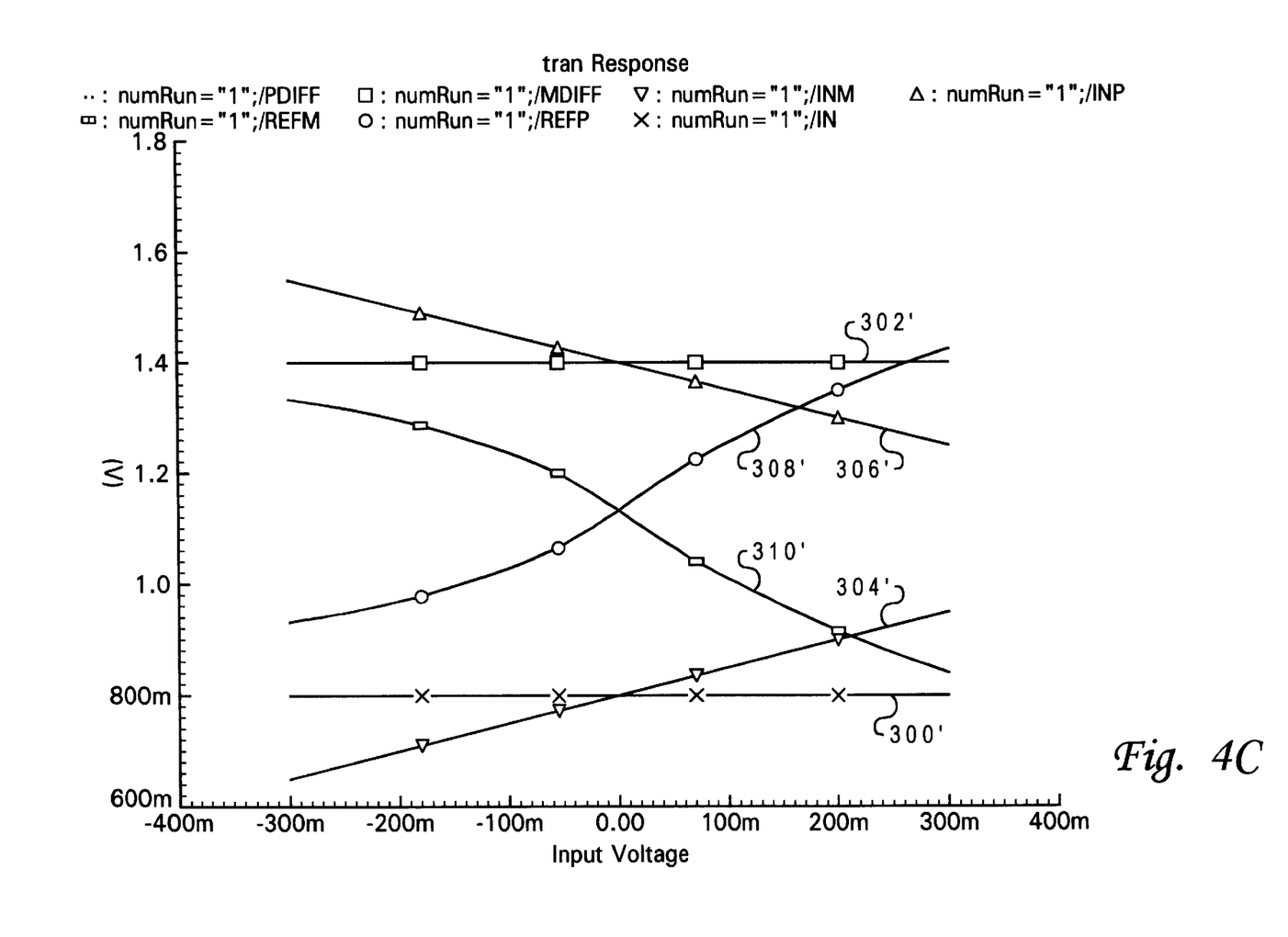
FIG. 4C depicts the differential gain of a preamplifier circuit having inverting reference voltage inputs in accordance with the prior art.

With reference now to FIGS. 4B and 4C, there are respectively illustrated differential gain characteristics for a preamplifier with positively biased reference voltage inputs in accordance with the present invention and a preamplifier of similar construction but having positively and negatively biased reference voltage inputs in accordance with the prior art. For ease of understanding, input and output voltage signals are identified in FIG. 4C with the same reference numerals utilized in FIG. 4B, but with the addition of a prime (') notation to indicate that the voltage values of the signals may differ from the corresponding signals in FIG. 4B.

In the embodiment of the present invention depicted in FIG. 4B, the upper reference voltage input (+Ref) has a value of 1.4 V as shown at reference numeral 300, and, as shown at reference numeral 302, the lower reference voltage input (−Ref) has a value of 800 mV, thus yielding a differential reference voltage (+Ref−(−Ref)) of 600 mV. Because prior art differential comparators invert the reference voltage inputs, the upper and lower reference voltages of the prior art comparator are 800 mV and 1.4 V, respectively, yielding a differential reference voltage of −600 mV, as shown in FIG. 4C. As further shown in FIGS. 4B and 4C, the value of the positive analog data input (+In) 304 of preamplifier 222 of the present invention (and similarly the value of the negative analog data input (−In) 306' of the prior art differential comparator) ranges between 1250 mV and 1550 mV. The value of the negative analog data input (−In) 306 of preamplifier 222 of the present invention (and similarly the value of the positive analog data input (+In) 304' of the prior art differential comparator) ranges between 650 mV and 950 mV.

With these input values, preamplifier 222 of the present invention achieves a gain of approximately 3.3, as shown in FIG. 4B by the slopes of voltage characteristics 308 and 310 of positive and negative output nodes 288a and 288b, respectively. With equivalent inputs, a preamplifier of similar construction but inverting reference voltage inputs in accordance with the prior art obtains a gain of only 1.6, as indicated in FIG. 4C by the slopes of output voltage characteristics 308' and 310'. Moreover, as can be seen by comparison of FIGS. 4B and 4C, the approximately 1040 mV dynamic output voltage range provided by preamplifier 222 of the present invention is significantly greater than the 600 mV output voltage range of the prior art configuration.

An ADC in accordance with the present invention can find application in any electrical system in which conversion between analog and digital signal is required. For example, referring now to FIG. 5, there is depicted an illustrative embodiment of a data processing system 400 having a magnetic storage device containing an ADC in accordance with the present invention. As shown, data processing system 400 includes a central processing unit (CPU) 440 and a system memory 442 coupled to an interconnect 446. Also coupled to interconnect 446 is a drive controller 444 for a magnetic storage device 401, which may comprise, for example, a SCSI disk drive.

Figure 5:
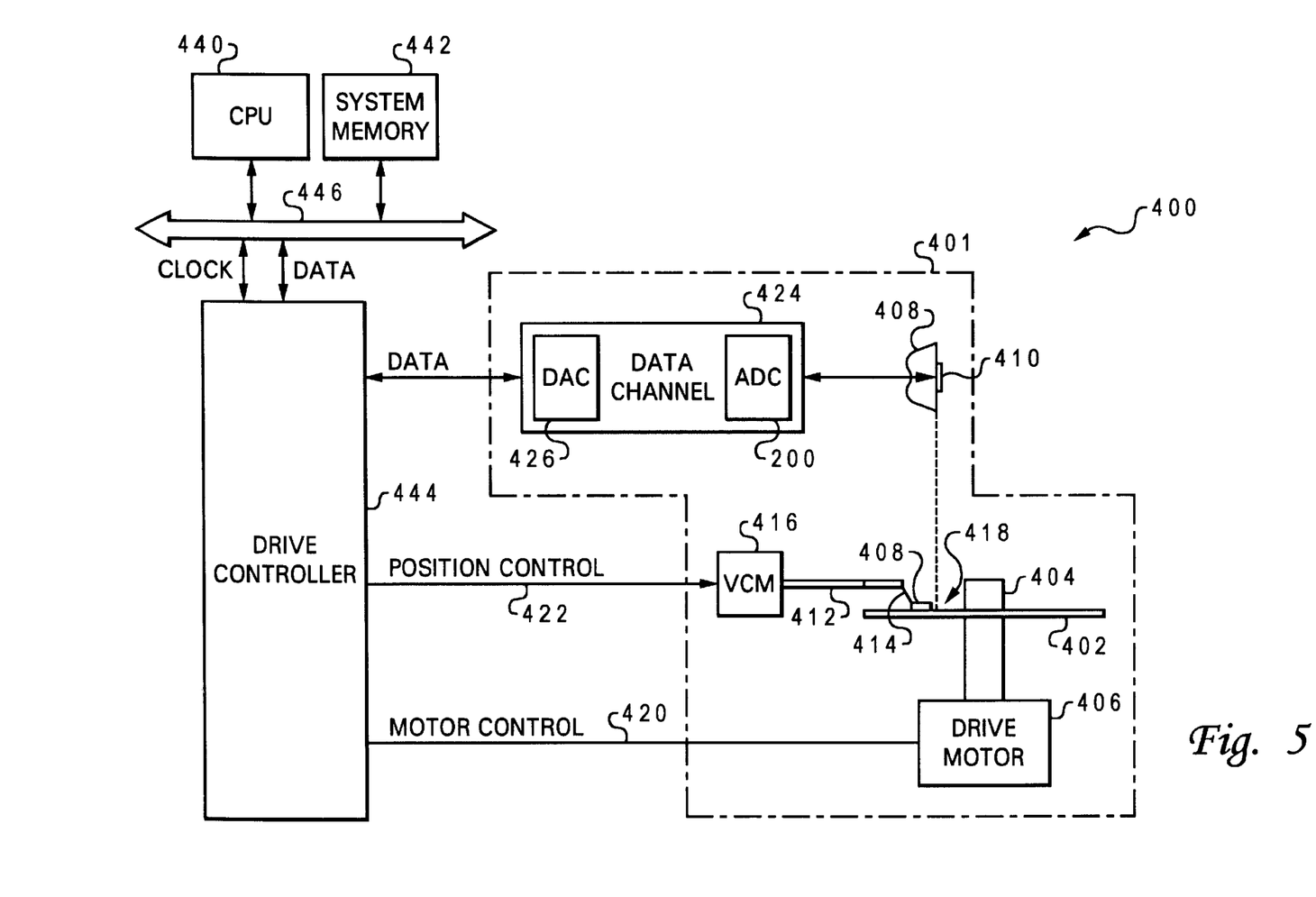
FIG. 5 illustrates an exemplary embodiment of a data processing system incorporating an ADC in accordance with the present invention.

Magnetic storage device 401 includes a housing (not illustrated) containing at least one rotatable magnetic disk 402 supported on a spindle 404 and rotated by a drive motor 406 in response to motor control signals 420 generated by drive controller 444. Each magnetic disk 402 has a magnetic recording medium formed on at least one disk surface 418, where the magnetic recording medium is arranged in an annular pattern of concentric data tracks (not shown). At least one slider 408 including one or more magnetic read/write heads 410 is positioned over magnetic disk 402. Slider 408 is suspended from an actuator arm 412 by a suspension 414 (also referred to as a head gimbal assembly (HGA)). The radial position of slider 408 with respect to the tracks of magnetic disk 402 is controlled by voice coil motor (VCM) 416 in response to position control signals 422 generated by drive controller 444.

During operation of magnetic storage device 401, the rotation of magnetic disk 402 generates an air bearing between slider 408 and disk surface 418 that supports slider 408 above disk surface 418 by a small, substantially constant spacing. As magnetic disk 402 is rotated by drive motor 406, slider 408 is moved radially in and out in response to the movement of actuator arm 412 by VCM 416, thus permitting magnetic read/write head 410 to read or write data of interest in different tracks. Read and write signals are communicated to and from read/write head 410 via data channel 424. As shown, data channel 424 includes both a digital-to-analog converter (DAC) 426 to convert data to be written onto disk 402 from digital to analog format, and an ADC 200 in accordance with the present invention to convert data read from disk 402 from analog to digital format for use within data processing system 400. The design of ADC 200 is well-suited for high speed applications such as the data conversion performed in data channel 424 in that conversion speeds of 1.2 ns are possible utilizing currently available complementary metal-oxide-semiconductor (CMOS) fabrication technology.

As has been described, the present invention provides an improved ADC including a single resistor ladder, a plurality of comparators and an encoder. Each of the plurality of comparators has an output coupled to the encoder and four inputs: two reference voltage inputs coupled to the resistor ladder and two analog data inputs that receive the analog data signal to be converted. In contrast to prior art ADCs having inverting reference voltage inputs, an ADC in accordance with the present invention positively biases the differential reference voltage inputs of the plurality of comparators, which results in improved differential gain, dynamic output voltage range, and voltage symmetry.

While the invention has been particularly shown and described with reference to a preferred embodiment, it will be understood by those skilled in the art that various changes in form and detail may be made therein without departing from the spirit and scope of the invention.

What is claimed is:

1. An analog-to-digital comprising:

a resistor ladder comprising a plurality of resistors coupled in series;

a differential analog data input having first and second analog data terminals;

a plurality of comparators having one or more pairs of comparators that each include a first comparator and a second comparator, the first and second comparators having first and second analog data inputs, two reference voltage inputs, and an output, the second comparator having an inverted output, the first analog data input of each first comparator being coupled to the first analog data terminal and the corresponding first analog data input of each second comparator being coupled to the second analog data terminal, and the two reference voltage inputs being coupled to the resistor ladder such that the two reference voltage inputs of each comparator include a positive reference voltage input and a negative reference voltage input; and an encoder, coupled to the outputs of all of the plurality of comparators, that encodes signals at the outputs of the plurality of comparators into a digital signal, wherein for each and every comparator having an output coupled to the encoder, the positive reference voltage input is coupled to a point on the resistor ladder of relatively higher potential than its negative reference voltage input.

2. An analog-to-digital converter, comprising:

a resistor ladder comprising a plurality of resistor coupled in series;

a differential analog data input;

a plurality of comparators that each have an output, two analog data inputs coupled to the differential analog data input, a preamplifier, and two reference voltage inputs that are each coupled to the resistor ladder, wherein the two reference voltage inputs of each comparator include a positive reference voltage input and a negative reference voltage input, the preamplifier including first, second and third complementary pairs of transistors, the first and second pairs of transistors being coupled in parallel and the third complementary pair being coupled between reference voltage terminals in series with the first and second complementary pairs of transistors the transistors in each of the first and second complementary pairs are connected at a respective one of the first and second differential output nodes, wherein each of the first and second differential output nodes is coupled via a respective biasing element to a single common node, the transistors in the third complementary pair each have a respective gate coupled to the common node; and an encoder, coupled to the outputs of all of the plurality of comparators, that encodes signals at the outputs of the plurality of comparators into a digital signal, wherein for each and every comparator having an output coupled to the encoder, the positive reference voltage input is coupled to a point on the resistor ladder of relatively higher potential than its negative reference voltage input.

3. A data processing system comprising:

at least a digital component and an analog component; and an analog-to-digital converter interposed between the digital component and the analog component to facilitate communication therebetween, the analog-to-digital convertor including:
  a resistor ladder comprising a plurality of resistor coupled in series;
  a differential analog data input;
  a plurality of comparators that each have an output, two analog data inputs coupled to the differential analog data input, a preamplifier, and two reference voltage inputs that are each coupled to the resistor ladder, where the two reference voltage inputs of each comparator include a positive reference voltage input and a negative reference voltage input, the preamplifier including first, second and third complementary pairs of transistors, the first and second pairs of transistors being coupled in parallel and the third complementary pair being coupled between reference voltage terminals in series with the first and second complementary pairs of transistors, the transistors in each of the first and second complementary pairs are connected at a respective one of the first and second differential output nodes, wherein each of the first and second differential output nodes is coupled via a respective biasing element to a single common node, the transistors in the third complementary pair each have a respective gate coupled to the common node; and
  an encoder, coupled to the outputs of all of the plurality of comparators, that encodes signals at the outputs of the plurality of comparators into a digital signal, wherein for each and every comparator having an output coupled to the encoder, the positive reference voltage input is coupled to a point on the resistor ladder of relatively higher potential than its negative reference voltage input.

4. A method of convert an analog data signal to a digital signal in an analog-to-digital converter having an encoder and a plurality of comparators that each have two analog data inputs and positive and negative reference voltage inputs, the plurality of comparators including one or more pairs of comparators that each include a first comparator and a second comparator each of which have first and second analog data inputs, the method comprising:

at each comparator, providing a comparator output to the encoder, receiving the differential analog data signal at the two analog data inputs;

receiving at the negative reference voltage input a respective first reference voltage and receiving at the positive reference voltage input a respective higher second reference voltage;

comparing the differential analog data signal with a respective positive differential between the first and second reference voltages; and generating a respective comparator output indicative of a result of the comparing;

the encoder encoding comparator outputs of the plurality of comparators into a digital signal;

coupling the first analog data input of each first comparators to the first analog data terminal and coupling the corresponding first analog data input of each second comparator to the second analog data terminal; and inverting the output of the second comparator of each pair.

5. A data processing system, comprising:

at least a digital component and an analog component; and an analog-to-digital converter interposed between the digital component and the analog component to facilitate communication therebetween, the analog-to-digital convertor including:
  a resistor ladder comprising a plurality of resistors coupled in series;
  a differential analog data input having first and second analog data terminals,
  a plurality of comparators having one or more pairs of comparators that each include a first comparator and a second comparator, the first and second comparators having first and second analog data inputs, two reference voltage inputs, and an output, the second comparator having an inverted output, the first analog data input of each first comparator being coupled to the first analog data terminal and the corresponding first analog data input of each second comparator being coupled to the second analog data terminal, and the two reference voltage inputs being coupled to the resistor ladder such that the two reference voltage inputs of each comparator include a positive reference voltage input and a negative reference voltage input; and
  an encoder, coupled to the outputs of all of the plurality of comparators, that encodes signals at the outputs of the plurality of comparators into a digital signal, wherein for each and every comparator having an output coupled to the encoder, the positive reference voltage input is coupled to a point on the resistor ladder of relatively higher potential than its negative reference voltage input.

* * * * *